United States Patent [19]

Hillmann

[11] Patent Number: 4,503,602
[45] Date of Patent: Mar. 12, 1985

[54] METHOD FOR THE MANUFACTURE OF A SUPERCONDUCTING HOLLOW CONDUCTOR

[75] Inventor: Hans Hillmann, Rodenbach, Fed. Rep. of Germany

[73] Assignee: Vacuumschmelze GmbH, Hanau, Fed. Rep. of Germany

[21] Appl. No.: 389,558

[22] Filed: Jun. 17, 1982

[30] Foreign Application Priority Data

Jul. 10, 1981 [DE] Fed. Rep. of Germany ....... 3127292

[51] Int. Cl.³ .................... H01B 5/08; H01V 11/00
[52] U.S. Cl. .................... 29/599; 174/126 S; 174/126 CP; 174/126 CS
[58] Field of Search ............ 29/599 US, 599; 174/126 S, 126 CP, 126 CS

[56] References Cited

U.S. PATENT DOCUMENTS

| | | | |
|---|---|---|---|
| 3,570,118 | 3/1971 | Reynolds et al. | 29/599 |
| 3,800,414 | 4/1974 | Shattes et al. | 29/599 |
| 4,336,420 | 6/1982 | Benz | 29/599 |
| 4,377,032 | 3/1983 | Benz | 29/599 |

*Primary Examiner*—Howard N. Goldberg
*Assistant Examiner*—V. K. Rising
*Attorney, Agent, or Firm*—Kenyon & Kenyon

[57] ABSTRACT

A method for manufacturing a superconducting hollow conductor, with superconducting conductor strands arranged in the interior of a tube through which coolant flows, which allows simple manufacture of long conductor sections, includes enclosing the helical conductor strands in a longitudinally welded tubular carrier body and subsequently drawing the carrier body to an inside diameter which is smaller than the original outside diameter of the helical conductor strands to obtain a mechanically strong conductor arrangement with a defined uniform flow cross-section for the coolant.

5 Claims, 6 Drawing Figures

METHOD FOR THE MANUFACTURE OF A SUPERCONDUCTING HOLLOW CONDUCTOR

BACKGROUND OF THE INVENTION

This invention relates to superconductors in general and more particularly to a method for the manufacture of a conductor arrangement of superconductive conductor strands in which the conductor strands lie against the inside wall of a tubular carrier body in helical fasion.

DE-OS No. 19 40 147 describes a conductor arrangement of several conductor strips for superconducting cables. In this arrangement the conductor strands are arranged helically in the interior of a tubular carrier body.

It is an object of the present invention to describe a method for manufacturing a superconducting hollow conductor of this type, by means of which large conductor lengths can be produced in a simple manner and with which a mechanically strong and particularly well coolable conductor arrangement is obtained.

SUMMARY OF THE INVENTION

According to the present invention, the conductor strands are wound to form a helix; the helical conductor strands are arranged in the tubular carrier body; and, subsequently, the tubular carrier body is deformed by rolling or drawing into a tube with an inside diameter which is smaller as compared to the original outside diameter of the helical conductor strands.

DETAILED DESCRIPTION

Figure 1:
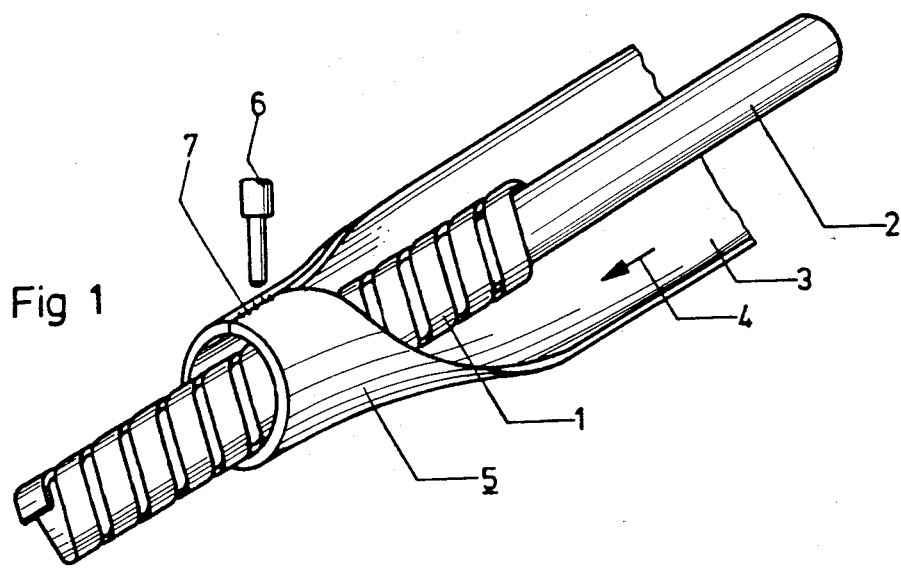
FIG. 1 is a perspective view of one embodiment of the process of the present invention.

FIG. 1 shows the conductor arrangement during the manufacture in a perspective view. Tools for manufacturing the tubular carrier body and the helical conductor strands are well known in the art and not shown. The conductor strands 1 are wound around a thin arbor 2. This is done, for instance, by holding one end of the conductor strand 1 fixed at the arbor circumference and rotating the arbor 2. Beforehand, a metal strip which has good spring properties can be attached to the conductor strand 1 to impart springiness to the wound helix. Under the arbor 2 with the helix of the conductor strand 1 wound thereon is a sheet metal part 3 which consists, for instance, of stabilizing metal for the super conductor, but may also be made of steel or another alloy with greater strength in order to obtain good mechanical strength. Good properties are obtained if a metal sheet 3 of a composite steel-copper material is used. Sheet 3 can be coated on the surface facing the arbor 2 with a solder foil.

The metal sheet 3 is moved together with the wound helix in the direction of the arrow 4 and is deformed in the process by drawing, rolling or the like to form a tubular carrier body 5. At the point where the two sides of the metal sheet 3 touch, they are welded together by means of a welding electrode 6.

Figure 2:
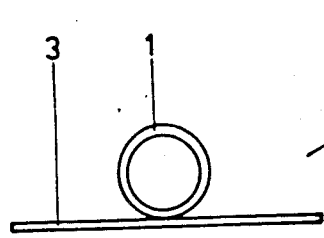
FIGS. 2–4 illustrate individual steps of the process of FIG. 1.
Figure 3:
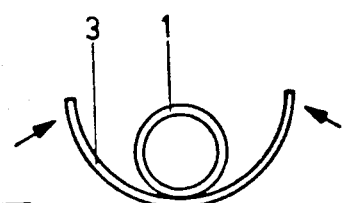
Figure 4:
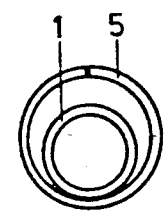

FIGS. 2 to 4 show different stages of forming the metal sheet 3 into the tubular carrier body 5. It is seen therefrom that the helical conductor strands 1 make contact in the middle of the metal sheet 3 (FIG. 2); that the metal sheet is then bent upward into a semicircle (FIG. 3); and that this semicircle is subsequently made into a complete circle and therefore into the complete carrier body 5 (FIG. 4). The inside diameter of the carrier body 5 is larger than the outside diameter of the helical conductor strands 1, so that the welded seam 7 is spaced from the conductor strands 1 and undue heating of the conductor strands 1 by the welding is thus avoided.

Figure 5:
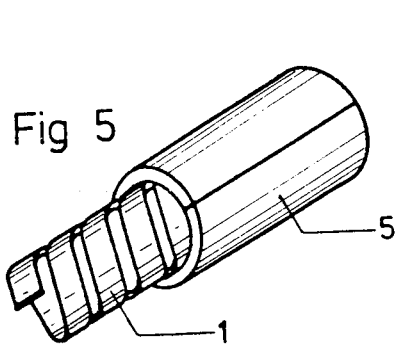
FIG. 5 is a perspective view of the embodiment of FIG. 1 after reduction of the carrier.

FIG. 5 shows the tubular carrier body 5 with the helical conductor strands 1 inside after the carrier body 5 has been reduced by drawing or rolling to an inside diameter which corresponds to the outside diameter of the helical conductor strands 1.

Figure 6:
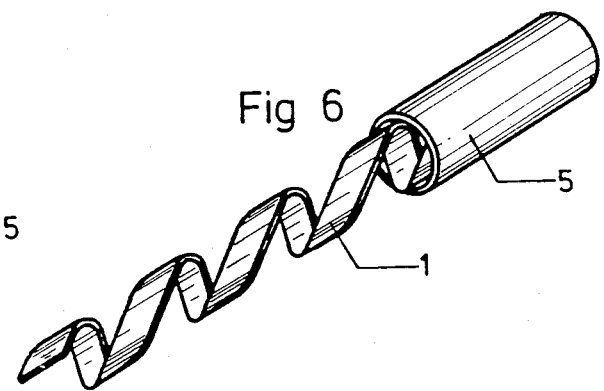
FIG. 6 illustrates the stretching of the helix after reduction.

By further drawing or rolling, the diameter of the tubular carrier body 5 is subsequently or in the same operation reduced further as FIG. 6 shows, while the length of the tube is increased at the same time. The helix consisting of the conductor strands is likewise stretched and the pitch of the helix is increased, so that larger spaces between the turns of the helical conductor strands are obtained. These larger spaces improve the cooling effect of the coolant flowing in the interior of the carrier body 5 considerably.

Although a single helix or conductor strand 1 is shown in the illustrated embodiment, multi-thread helical conductor strands 1 can also be used, of course. It is furthermore possible to manufacture the conductor shown in FIG. 6 in sections if the helical conductor strands are inserted into an otherwise produced tube and the diameter of the latter is then reduced accordingly by rolling or drawing.

To fasten the conductor strands 1 to the inside wall of the carrier body 5 in a particularly secure manner, a solder foil may be arranged between the conductor strands and the carrier body 5, and the conductor strands can be soldered to the carrier body 5, after drawing to the final dimension, by a heat treatment. However, it is also possible, for instance, by applying a layer of elastic material to the conductor strands, to adjust the properties of the helical conductor strands in such a manner that the conductor strands rest resiliently against the inside walls of the carrier body 5 and are thus sufficiently connected to the latter.

What is claimed is:

1. A method for manufacturing a conductor arrangement of superconductive conductor strands, in which the conductor strands rest in helical fashion against the inside wall of a tubular carrier body, comprising:
    (a) winding the conductor strands to form a helix which has a hollow central part;
    (b) arranging the hollow helix in a tubular carrier body; and
    (c) subsequently deforming the tubular carrier body by drawing or rolling into a tube of smaller inside diameter than the original outside diameter of the helix made up of the helically wound conductor strands to thereby increase the pitch of the helix causing large spaces to be formed between turns but without cross section reduction of said strands.

2. The method according to claim 1, comprising winding the helical conductor strands over an arbor.

3. The method according to claim 1 or 2, comprising arranging the helix in a tubular carrier body by steps comprising disposing said helix on a sheet metal part; bending said sheet metal part to form a cylinder and joining the edges of the sheet metal part together by means of a welded seam.

4. The method according to claim 1, comprising coating the tubular carrier body on its inside surface with a solder foil and, after the rolling or drawing of the tubular carrier body to its final diameter, soldering the conductor strands to the tubular carrier body by heating.

5. The method according to claim 1, comprising connecting the conductor strands, before the helix is made, to a metal strip which has good spring properties.

* * * * *